United States Patent
Yun et al.

(10) Patent No.: US 11,971,618 B2
(45) Date of Patent: Apr. 30, 2024

(54) DISPLAY DEVICE

(71) Applicant: Samsung Display Co., LTD., Yongin-si (KR)

(72) Inventors: Huigyeong Yun, Hwaseong-si (KR); Ji-Hyun Ka, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/129,842

(22) Filed: Apr. 1, 2023

(65) Prior Publication Data
US 2023/0314853 A1   Oct. 5, 2023

(30) Foreign Application Priority Data

Apr. 1, 2022   (KR) .......................... 10-2022-0041122

(51) Int. Cl.
*G02F 1/13*        (2006.01)
*G02F 1/13357*   (2006.01)
(Continued)

(52) U.S. Cl.
CPC ...... *G02F 1/1323* (2013.01); *G02F 1/133621* (2013.01); *G02F 1/134309* (2013.01);
(Continued)

(58) Field of Classification Search
None
See application file for complete search history.

(56) References Cited

U.S. PATENT DOCUMENTS

| 2006/0038770 A1* | 2/2006 | Burkholder | ....... G02F 1/133621 345/102 |
| 2006/0187378 A1* | 8/2006 | Bong | ..................... H10K 59/35 349/69 |

(Continued)

FOREIGN PATENT DOCUMENTS

| KR | 1020070003181 | 1/2007 |
| KR | 101431830 | 8/2014 |

(Continued)

OTHER PUBLICATIONS

Extended European Search Report for Application No. 23158949.0-1020 dated Aug. 25, 2023 enumerating the above listed references.

*Primary Examiner* — Ryan Crockett
(74) *Attorney, Agent, or Firm* — CANTOR COLBURN LLP

(57) ABSTRACT

A display device includes a substrate including a first pixel area and a second pixel area, a display panel disposed on the substrate and including a first light-emitting diode emitting a first light having a first color and overlapping the first pixel area and a second light-emitting diode emitting a second light having the first color and overlapping the second pixel area, a first pixel electrode which is disposed on the display panel and overlaps the first pixel area, and in which first slits are defined, a second pixel electrode which is disposed on the display panel, is spaced apart from the first pixel electrode, and overlaps the second pixel area, and in which second slits extending in a direction different from the first slits are defined, a common electrode layer and a liquid crystal layer disposed between the first and second pixel electrodes and the common electrode layer and including a plurality of liquid crystal molecules.

20 Claims, 10 Drawing Sheets

(51) Int. Cl.
*G02F 1/1343* (2006.01)
*H10K 59/12* (2023.01)
*H10K 59/80* (2023.01)

(52) U.S. Cl.
CPC ....... *G02F 1/13439* (2013.01); *H10K 59/879* (2023.02); *H10K 59/12* (2023.02)

(56) References Cited

U.S. PATENT DOCUMENTS

| | | | | |
|---|---|---|---|---|
| 2009/0310064 | A1* | 12/2009 | Choe | G02B 5/0278 349/112 |
| 2013/0052341 | A1* | 2/2013 | Odagiri | G02B 5/3083 359/492.01 |
| 2015/0177579 | A1* | 6/2015 | Lim | G02F 1/1368 345/90 |
| 2016/0042703 | A1* | 2/2016 | Fan | G02F 1/133621 345/88 |
| 2021/0132450 | A1* | 5/2021 | Sakai | G02F 1/134363 |
| 2022/0013615 | A1* | 1/2022 | Baek | G02F 1/13629 |

FOREIGN PATENT DOCUMENTS

| | | |
|---|---|---|
| KR | 101928939 | 3/2019 |
| KR | 1020190130642 | 11/2019 |

\* cited by examiner

DISPLAY DEVICE

This application claims priority to Korean Patent Application No. 10-2022-0041122, filed on Apr. 1, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to the display device capable of adjusting a viewing angle.

2. Description of the Related Art

A display device is a device which displays an image for providing visual information to a user. Recently, as a thickness and a weight of the display device are being decreased, uses of the display device are being diversified.

The display device may provide different visual information depending on a viewing angle.

SUMMARY

In general, a display device is manufactured to implement a wide viewing angle, but it may be desired to temporarily implement the display device with a narrow viewing angle so that a screen of the display device is viewed only at a predetermined position.

Embodiments provide a display device capable of adjusting a viewing angle.

A display device in an embodiment may include a substrate including a first pixel area and a second pixel area adjacent to the first pixel area, a display panel disposed on the substrate and including a first light-emitting diode emitting a first light having a first color and overlapping the first pixel area and a second light-emitting diode emitting a second light having the first color and overlapping the second pixel area, a first pixel electrode which is disposed on the display panel and overlaps the first pixel area, and in which first slits are defined, a second pixel electrode which is disposed on the display panel, is spaced apart from the first pixel electrode, and overlaps the second pixel area, and in which second slits extending in a direction different from the first slits are defined, a common electrode layer disposed on the first pixel electrode and the second pixel electrode and a liquid crystal layer disposed between the first and second pixel electrodes and the common electrode layer and including a plurality of liquid crystal molecules.

In an embodiment, the first slits may extend in a first diagonal direction, and the second slits may extend in a second diagonal direction crossing the first diagonal direction.

In an embodiment, the first diagonal direction and the second diagonal direction may be perpendicular to each other.

In an embodiment, the first pixel electrode and the second pixel electrode may be disposed in a same layer and include a same material.

In an embodiment, the first pixel electrode and the second pixel electrode may respectively receive different voltages from each other.

In an embodiment, the plurality of liquid crystal molecules may include first liquid crystal molecules overlapping the first pixel electrode and second liquid crystal molecules overlapping the second pixel electrode, and when the first pixel electrode receives a voltage different from that of the common electrode layer and the second pixel electrode receives a voltage equal to that of the common electrode layer, the first liquid crystal molecules may be arranged in a first direction crossing a vertical direction and the second liquid crystal molecules may be arranged in the vertical direction.

In an embodiment, the vertical direction may be a direction from the first pixel electrode to the common electrode layer and the first direction may be a diagonal direction with respect to the vertical direction.

In an embodiment, the liquid crystal layer may transmit the first light and may not transmit the second light.

In an embodiment, the first light-emitting diode may emit the first light in the vertical direction and the liquid crystal layer may change a traveling direction of the first light into a second direction crossing the first direction with the vertical direction interposed therebetween.

In an embodiment, the first pixel electrode and the second pixel electrode may receive a same voltage.

In an embodiment, the liquid crystal molecules may include first liquid crystal molecules overlapping the first pixel electrode and second liquid crystal molecules overlapping the second pixel electrode, and when each of the first pixel electrode and the second pixel electrode receives a different voltage from that of the common electrode layer, the first liquid crystal molecules may be arranged in a first direction crossing a vertical direction and the second liquid crystal molecules may be arranged in a third direction crossing the first direction with the vertical direction interposed therebetween.

In an embodiment, the liquid crystal layer may transmit the first light and the second light.

In an embodiment, the first light-emitting diode may emit the first light in the vertical direction and the second light-emitting diode may emit the second light in the vertical direction, and the liquid crystal layer may change a traveling direction of the first light into a second direction crossing the first direction with the vertical direction interposed therebetween and change a traveling direction of the second light in a fourth direction crossing the third direction with the vertical direction interposed therebetween.

A display device in an embodiment may include a substrate including a first pixel area, a second pixel area adjacent to the first pixel area, a third pixel area, and a fourth pixel area adjacent to the third pixel area, a display panel disposed on the substrate and including a first light-emitting diode, a second light-emitting diode, a third light-emitting diode, a fourth light-emitting diode, wherein the first light-emitting diode emits a first light having a first color and overlapping the first pixel area, the second light-emitting diode emits a second light having the first color and overlapping the second pixel area, the third light-emitting diode emits a third light having a second color different from the first color and overlapping the third pixel area, and the fourth light-emitting diode emits a fourth light having the second color and overlapping the fourth pixel area, a first pixel electrode which is disposed on the display panel and overlaps the first pixel area, and in which first slits are defined, a second pixel electrode which is disposed on the display panel, is spaced apart from the first pixel electrode, and overlaps the second pixel area, and in which second slits extending in a direction different from the first slits are defined, a third pixel electrode which is disposed on the display panel, is spaced apart from the first and second pixel electrodes, and overlaps the third pixel area, and in which third slits extending in a direction equal to the first slits are defined, a fourth pixel electrode which is disposed on the display panel, is spaced apart from the first to third pixel electrodes, and overlaps the fourth pixel area, and in which fourth slits extending in a direction equal to the second slits are defined, a common electrode layer disposed on the first to fourth pixel electrodes and a liquid crystal layer disposed between the first to fourth pixel electrode and the common electrode layer and including a plurality of liquid crystal molecules.

In an embodiment, the first to fourth pixel electrodes may be disposed in a same layer, and include a same material.

In an embodiment, the first pixel electrode and the third pixel electrode may receive a same voltage as each other and the second pixel electrode and the fourth pixel electrode may receive a same voltage as each other.

In an embodiment, each of the first to fourth pixel electrodes may receive a voltage different from that of the common electrode layer.

In an embodiment, the plurality of liquid crystal molecules may include first liquid crystal molecules overlapping the first pixel electrode, second liquid crystal molecules overlapping the second pixel electrode, third liquid crystal molecules overlapping the third pixel electrode, and fourth liquid crystal molecules overlapping the fourth pixel electrode, and when the first pixel electrode and the third pixel electrode receive the voltage, the first liquid crystal molecules and the third liquid crystal molecules may be arranged in a first direction crossing a vertical direction.

In an embodiment, the second pixel electrode and the fourth pixel electrode may receive the voltage, the second liquid crystal molecules and the fourth liquid crystal molecules may be arranged in a third direction crossing the first direction with the vertical direction interposed therebetween.

In an embodiment, the first to fourth light-emitting diodes may emit the first to fourth lights in the vertical direction, respectively, and the liquid crystal layer may change a traveling direction of each of the first light and the third light into a second direction crossing the first direction with the vertical direction therebetween, and change a traveling direction of each of the second light and the fourth light into a fourth direction crossing the third direction with the vertical direction therebetween.

In a display device in embodiments of the disclosure, a liquid crystal display panel may be disposed on the organic light-emitting display panel. A traveling direction of the light emitted from the organic light-emitting display panel may be changed by the liquid crystal display panel. As slits extending in a predetermined direction are defined in the liquid crystal display panel, the traveling direction of the light may be changed, and thus a viewing angle of the display device may be adjusted.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
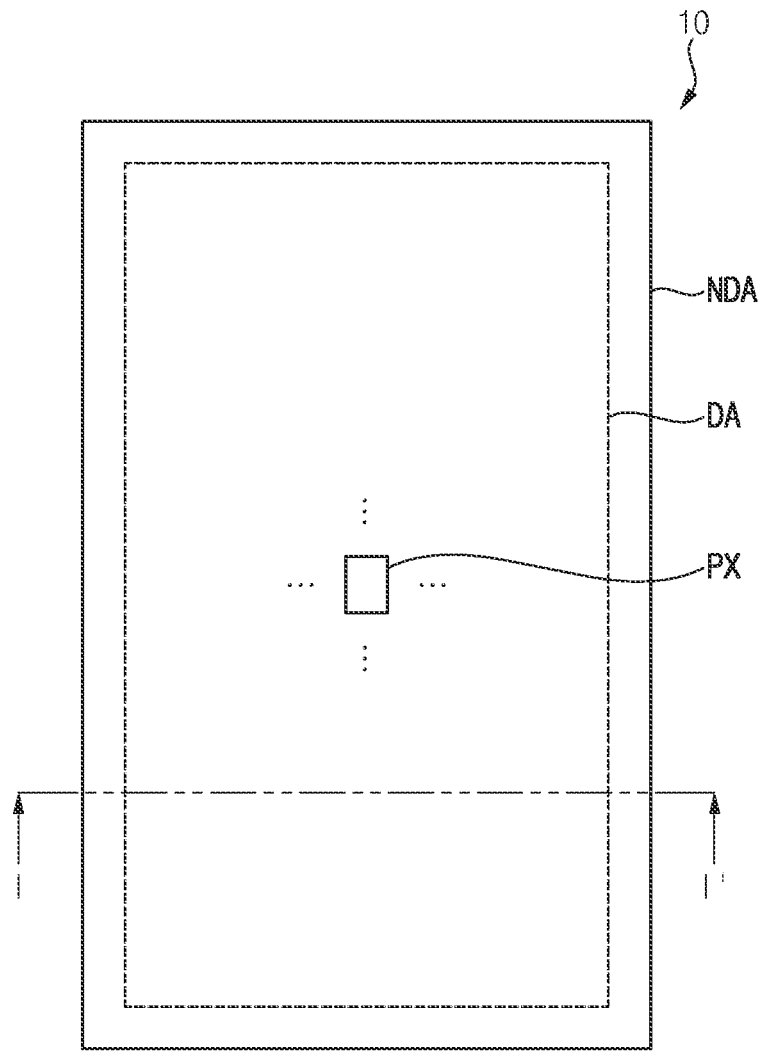
FIG. 1 is a plan view illustrating an embodiment of a display device.

Hereinafter, display devices in embodiments will be described in more detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper,"

depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
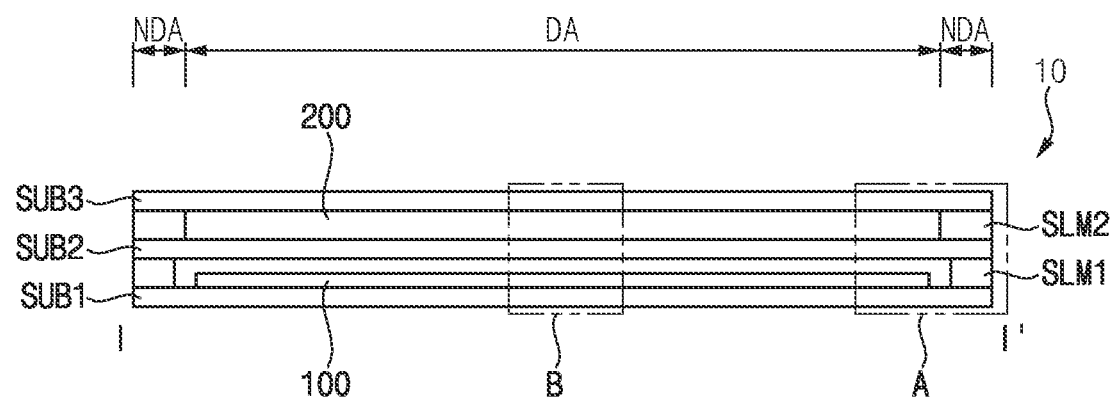
FIG. 2 is a cross-sectional view taken along line I-I' of FIG. 1.

FIG. 1 is a plan view illustrating an embodiment of a display device. FIG. 2 is a cross-sectional view taken along line I-I' of FIG. 1.

Referring to FIG. 1, a display device 10 may include a display area DA and a non-display area NDA. The display area DA may display a screen. A plurality of pixels PX which emit light and wirings which transmit a driving signal to the pixels PX may be disposed in the display area DA.

The non-display area NDA may surround the display area DA. The non-display area NDA may not display a screen. The wirings and drivers for driving may be disposed in the non-display area NDA. In an embodiment, a gate driver and a data driver may be disposed in the non-display area NDA, for example. Also, a sealing member (e.g., a first sealing member SLM1 and a second sealing member SLM2 of FIG. 3) may be disposed in the non-display area NDA. However, the disclosure is not limited thereto, and the non-display area NDA may also display a screen.

FIGS. 1 and 2, the display device 10 may include a first substrate SUB1, an organic light-emitting display panel 100, a second substrate SUB2, a liquid crystal display panel 200, a third substrate SUB3, a first sealing member SLM1, and a second sealing member SLM2.

The organic light-emitting display panel 100 may be disposed on the first substrate SUB1, and the second substrate SUB2 may be disposed on the organic light-emitting display panel 100. In addition, the liquid crystal display panel 200 may be disposed on the second substrate SUB2, and the third substrate SUB3 may be disposed on the liquid crystal display panel 200.

The first substrate SUB1, the second substrate SUB2, and the third substrate SUB3 may be entirely disposed in the display area DA and the non-display area NDA. The organic light-emitting display panel 100 and the liquid crystal display panel 200 may be disposed in the display area DA.

The first sealing member SLM1 may be disposed in the non-display area NDA on the first substrate SUB1. The first sealing member SLM1 may surround the organic light-emitting display panel 100. Similarly, the second sealing member SLM2 may be disposed in the non-display area NDA on the second substrate SUB2. The second sealing member SLM2 may surround the liquid crystal display panel 200.

Figure 3:
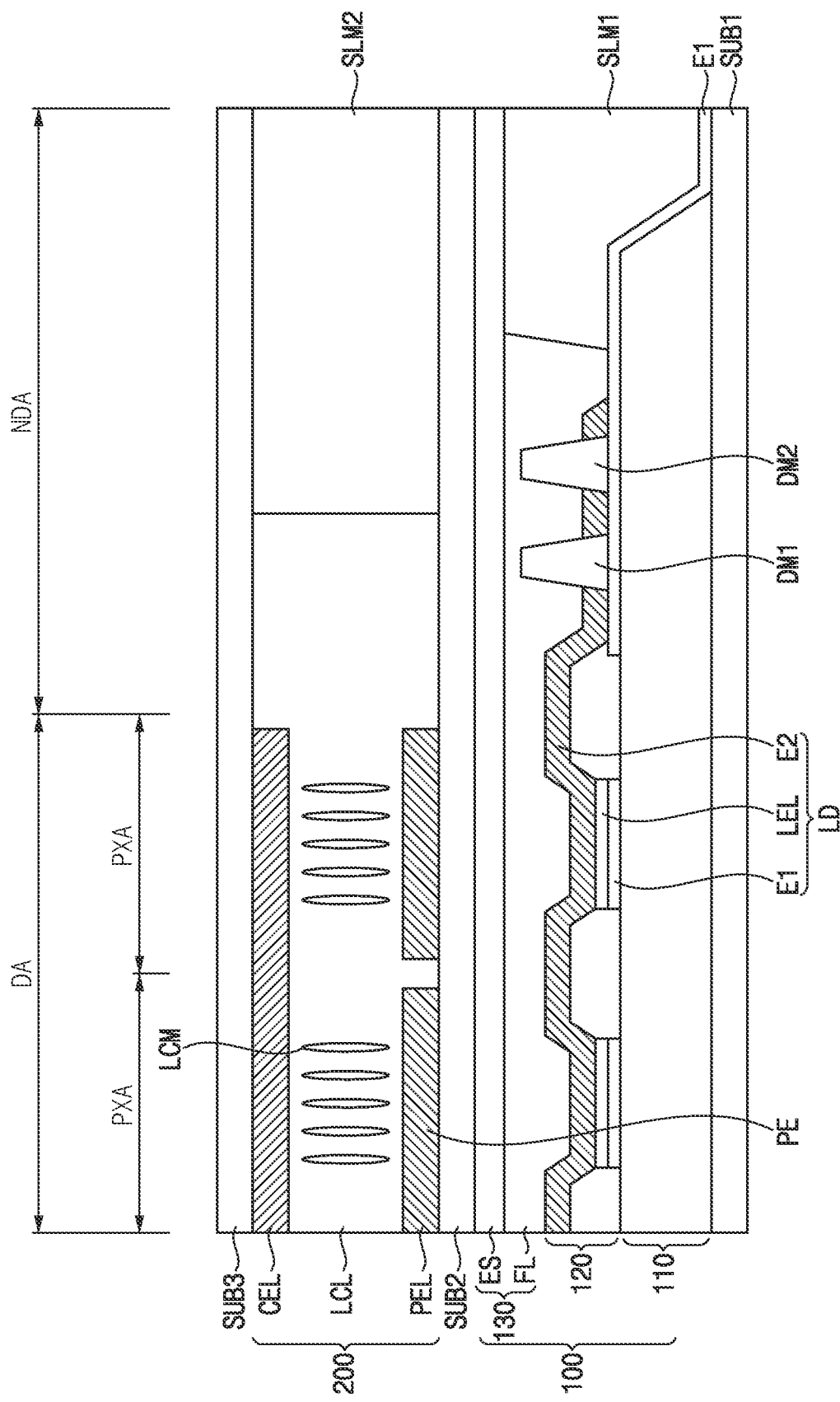
FIG. 3 is an enlarged cross-sectional view of area A of FIG. 2.
Figure 4:
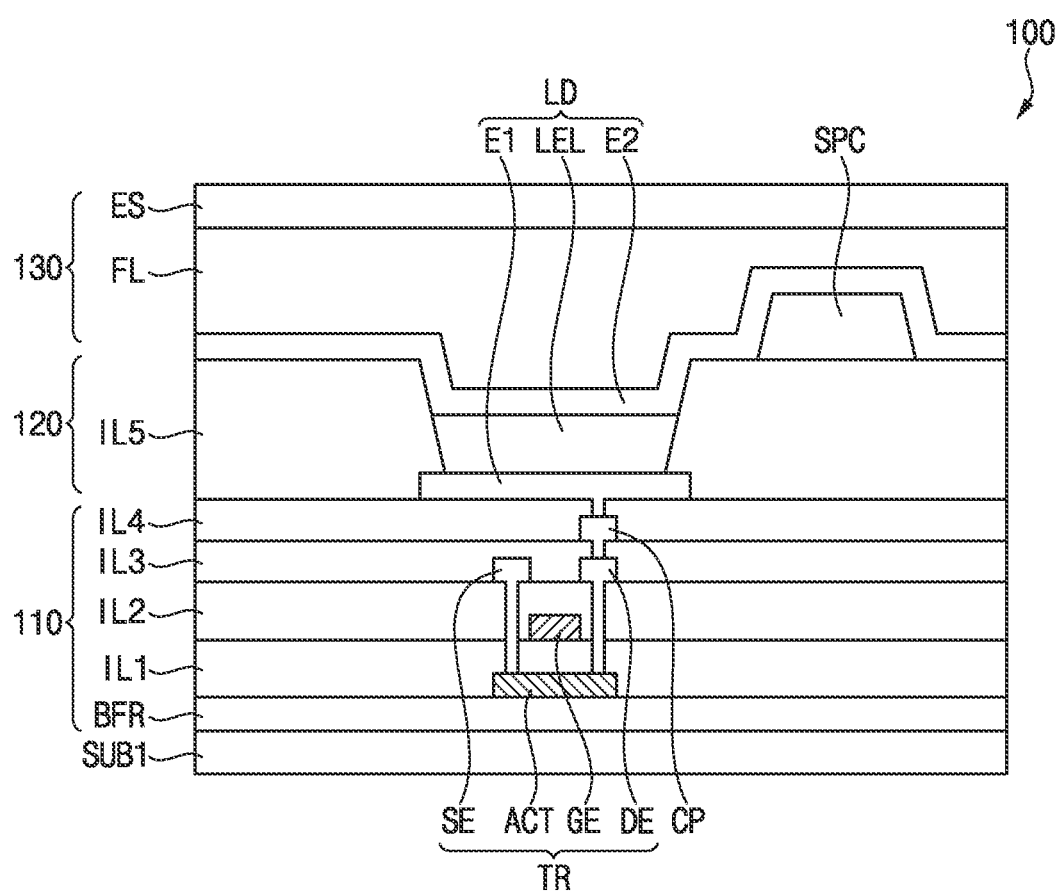
FIG. 4 is a cross-sectional view illustrating the organic light-emitting display panel of FIG. 3.

FIG. 3 is an enlarged cross-sectional view of area A of FIG. 2. FIG. 4 is a cross-sectional view illustrating the organic light-emitting display panel of FIG. 3.

Referring to FIGS. 1 to 3, the liquid crystal display panel 200 may be disposed on the organic light-emitting display panel 100. The organic light-emitting display panel 100 may emit light, and the liquid crystal display panel 200 may adjust a viewing angle of the light.

The organic light-emitting display panel 100 may include a circuit element layer 110, a light-emitting element layer 120, a first dam DM1, a second dam DM2, and an encapsulation layer 130. The liquid crystal display panel 200 may include a pixel electrode layer PEL, a liquid crystal layer LCL, and a common electrode layer CEL.

Referring further to FIG. 4, the circuit element layer 110 may be disposed on the first substrate SUB1, and include a buffer layer BFR, at least one transistor TR, a connection electrode CP, and a first insulation layer IL1, a second insulation layer IL2, a third insulation layer IL3, and a fourth insulation layer IL4. The transistor TR may include an active layer ACT, a gate electrode GE, a source electrode SE, and a drain electrode DE. The light-emitting element layer 120 may be disposed on the circuit element layer 110, and include a fifth insulation layer IL5, a spacer SPC, and a light-emitting diode LD. The light-emitting diode LD may include a first electrode E1, a light-emitting layer LEL, and a second electrode E2.

The first substrate SUB1 may include glass, quartz, plastic, or the like. The first substrate SUB1 may include pixel areas PXA in which the pixels PX are respectively disposed.

The buffer layer BFR may be disposed on the first substrate SUB1. The buffer layer BFR may prevent diffusion of metal atoms or impurities from the first substrate SUB1 to the active layer ACT.

The active layer ACT may be disposed on the buffer layer BFR. The active layer ACT may be divided into a source region and a drain region doped with impurities, and a channel region between the source region and the drain region.

The first insulation layer IL1 may be disposed on the buffer layer BFR. The first insulation layer IL1 may cover the active layer ACT and may have substantially the same thickness along a profile of the active layer ACT. However, the disclosure is not limited thereto. In an embodiment, the first insulation layer IL1 may include an inorganic material, for example.

The gate electrode GE may be disposed on the first insulation layer IL1. In an embodiment, the gate electrode GE may overlap the channel region of the active layer ACT.

The second insulation layer IL2 may be disposed on the first insulation layer IL1. Also, the second insulation layer IL2 may cover the gate electrode GE and may be disposed to have substantially the same thickness along a profile of the gate electrode GE. However, the disclosure is not limited thereto.

The source electrode SE and the drain electrode DE may be disposed on the second insulation layer IL2. The source electrode SE may contact the source region of the active layer ACT through a first contact hole defined in the first and second insulation layers IL1 and IL2. The drain electrode DE may contact the drain region of the active layer ACT through a second contact hole defined in the first and second insulation layers IL1 and IL2.

The third insulation layer IL3 may be disposed on the second insulation layer IL2. In addition, the third insulation layer IL3 may cover the source and drain electrodes SE and DE, and include a substantially flat top surface without creating a step around the source and drain electrodes SE and DE. In an embodiment, the third insulation layer IL3 may include an organic material, for example.

The connection electrode CP may be disposed on the third insulation layer IL3. The connection electrode CP may contact the source electrode SE or the drain electrode DE through a third contact hole defined in the third insulation layer IL3.

The fourth insulation layer IL4 may be disposed on the third insulation layer IL3. Also, the fourth insulation layer IL4 may cover the connection electrode CP, and include a substantially flat top surface without generating a step around the connection electrode CE In an embodiment, the fourth insulation layer IL4 may include an organic material, for example.

The first electrode E1 may be disposed on the fourth insulation layer IL4. The first electrode E1 may have reflective or transmissive properties. In an embodiment, the first electrode E1 may include a metal, for example.

The first electrode E1 may contact the connection electrode CP through a fourth contact hole defined in the fourth insulation layer IL4. Through this, the first electrode E1 may be connected to the transistor TR.

The fifth insulation layer IL5 may be disposed on the fourth insulation layer IL4, and define an opening exposing the upper surface of the first electrode E1. In an embodiment, the fifth insulation layer IL5 may include an organic material or an inorganic material, for example.

The spacer SPC may be disposed on the fifth insulation layer IL5. In an embodiment, the spacer SPC may include an organic material or an inorganic material, for example. The spacer SPC may maintain a gap between the encapsulation substrate ES and the first substrate SUB1.

The spacer SPC may include a material different from that of the fifth insulation layer IL5. The spacer SPC may be formed after the fifth insulation layer IL5 is formed.

However, the disclosure is not limited thereto, and the spacer SPC may include the same material as that of the fifth insulation layer IL5. In an embodiment, the fifth insulation layer IL5 and the spacer SPC may include an organic material such as polyimide, for example.

The light-emitting layer LEL may be disposed on the first electrode E1. The light-emitting layer LEL may be disposed in the opening defined in the fifth insulation layer IL5. In an embodiment, the light-emitting layer LEL may have a multilayer structure including a hole injection layer, a hole transport layer, an organic emission layer, an electron transport layer, and an electron injection layer. The organic emission layer may include a light-emitting material.

The second electrode E2 may cover the light-emitting layer LEL and may be disposed on the fifth insulation layer IL5 and the spacer SPC. In an embodiment, the second electrode E2 may have a plate shape. In addition, the second electrode E2 may have transmissive or reflective properties. In an embodiment, the second electrode E2 may include a metal, for example.

The encapsulation layer 130 may prevent moisture and oxygen from penetrating into the light-emitting diode LD from the outside. In an embodiment, the encapsulation layer 130 may include an encapsulation substrate ES and a filling layer FL, for example.

The encapsulation substrate ES may be disposed on the light-emitting diode LD. The filling layer FL may fill a space between the light-emitting diode LD and the encapsulation substrate ES.

However, the disclosure is not limited thereto, and the display device 10 may include a thin film encapsulation layer instead of the encapsulation substrate ES. In an embodiment, the thin film encapsulation layer may include a first inorganic encapsulation layer disposed on the second electrode E2, an organic encapsulation layer disposed on the first inorganic encapsulation layer, and a second inorganic encapsulation layer disposed on the organic encapsulation layer, for example.

The first dam DM1 and the second dam DM2 may be disposed in the non-display area NDA on the first substrate SUB1. The first dam DM1 may surround the display area DA in a plan view. The second dam DM2 may surround the first dam DM1 in a plan view. The number of the dams DM1 and DM2 is not limited thereto. The dams DM1 and DM2 may be formed as a single layer in which one organic layer is stacked. However, the disclosure is not limited thereto, and the dams DM1 and DM2 may be formed as a multi-layer in which a plurality of organic layers are stacked.

Figure 5:
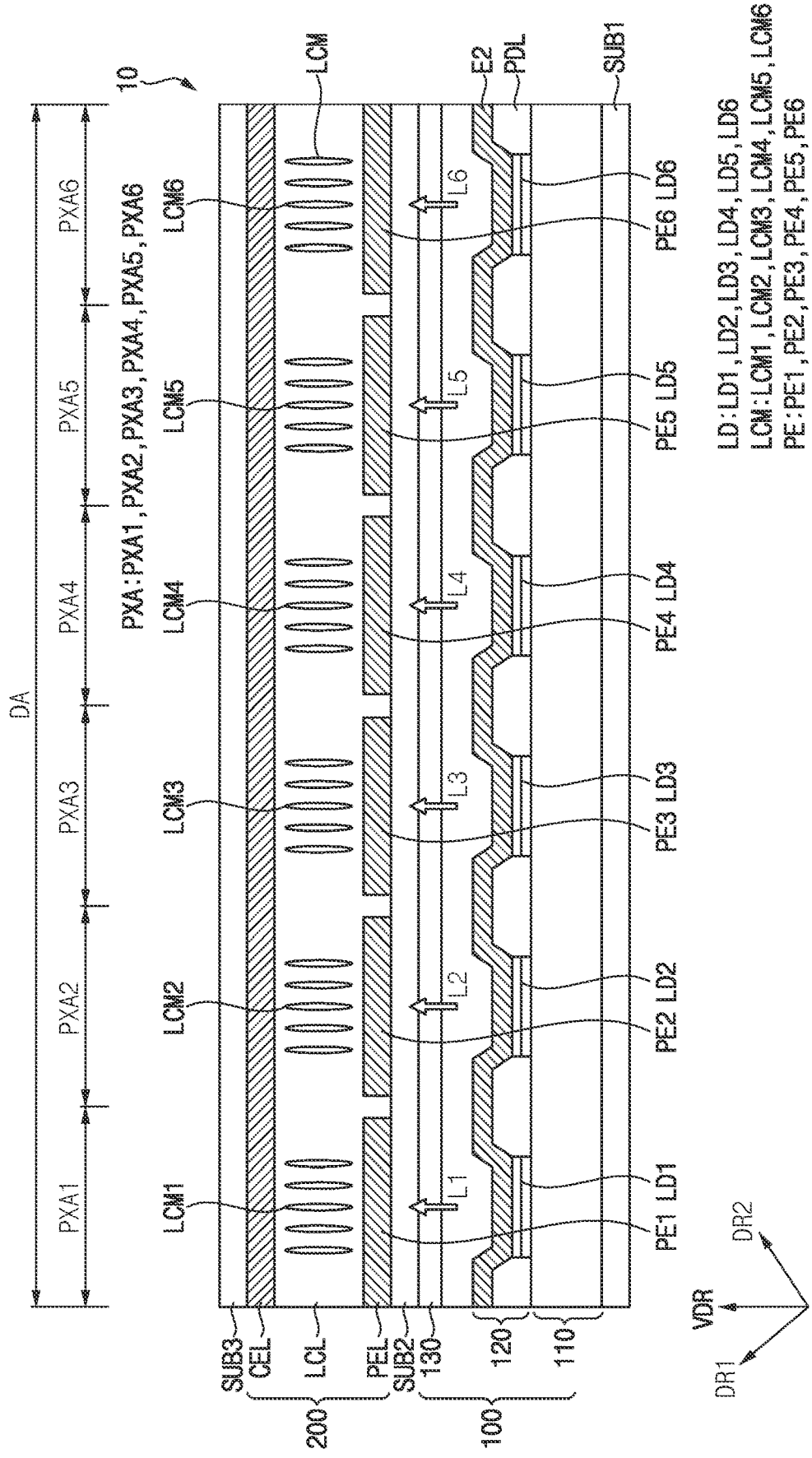
FIG. 5 is an enlarged cross-sectional view of area B of FIG. 2.
Figure 6:
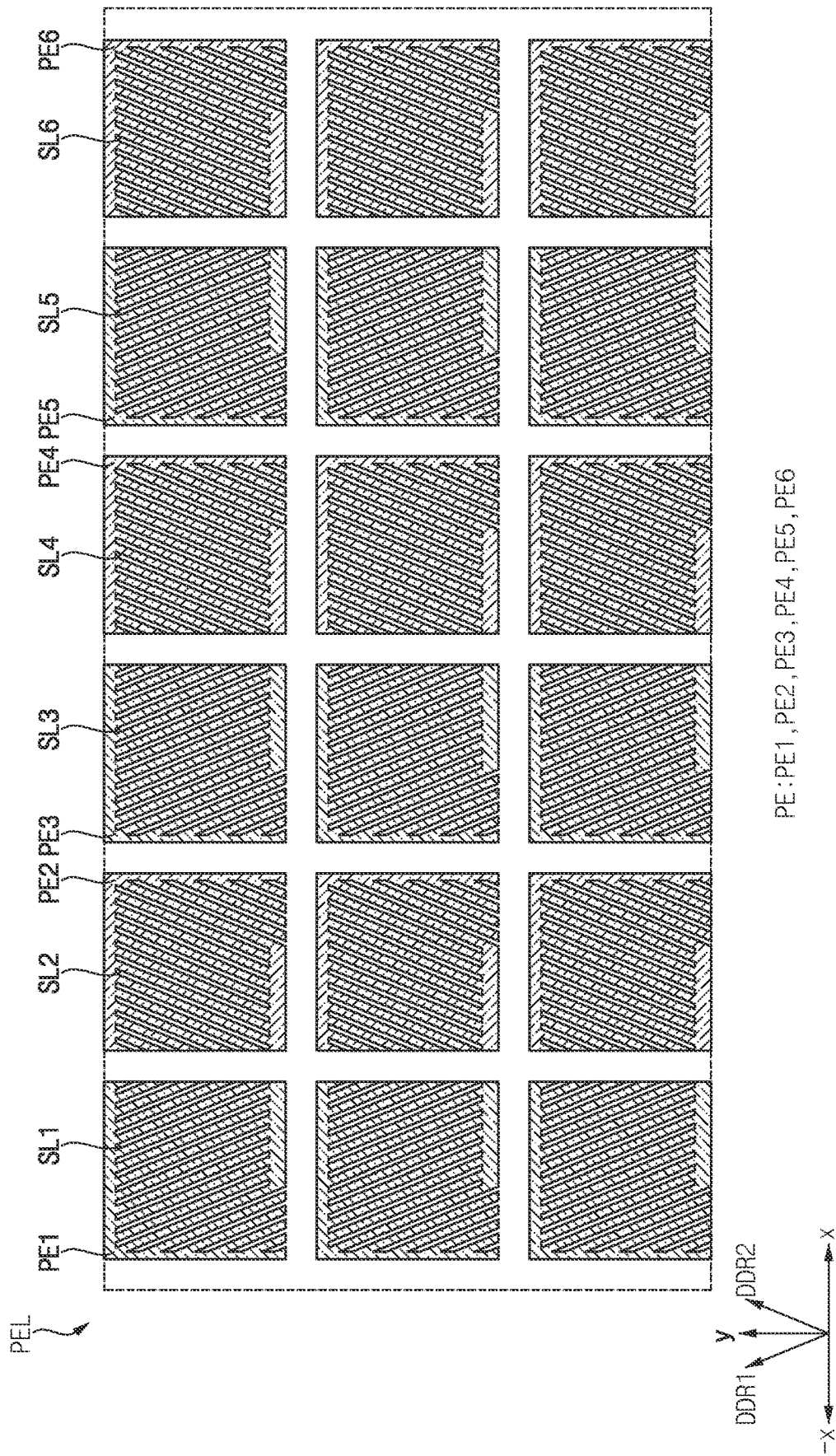
FIG. 6 is a plan view illustrating a planar arrangement of the pixel electrode layer of FIG. 5.

FIG. 5 is an enlarged cross-sectional view of area B of FIG. 2. FIG. 6 is a plan view illustrating a planar arrangement of the pixel electrode layer of FIG. 5.

Referring to FIGS. 5 and 6, the first substrate SUB1 may include the pixel areas PXA. In an embodiment, the first substrate SUB1 may include a first pixel area PXA1, a second pixel area PXA2, a third pixel area PXA3, a fourth pixel area PXA4, a fifth pixel area PXA5, and a sixth pixel area PXA6, for example. The first pixel area PXA1 and the second pixel area PXA2 may be adjacent to each other, the third pixel area PXA3 and the fourth pixel area PXA4 may be adjacent to each other, and the fifth pixel area PXA5 and the sixth pixel area PXA6 may be adjacent to each other. Also, the disclosure is not limited thereto.

The light-emitting diodes LD included in the light-emitting element layer 120 may be respectively disposed in the pixel areas PXA. In an embodiment, the light-emitting element layer 120 may include first to sixth light-emitting diodes LD1, LD2, LD3, LD4, LD5, and LD6, and the first to sixth light-emitting diodes LD1, LD2, LD3, LD4, LD5, and LD6 may overlap the first to sixth pixel areas PXA1, PXA2, PXA3, PXA4, PXA5, and PXA6, respectively, for example.

Adjacent light-emitting diodes LD among the first to sixth light-emitting diodes LD1, LD2, LD3, LD4, LD5, and LD6 may emit the same color as each other. In an embodiment, the first light-emitting diode LD1 may emit a first light L1 having a first color, and the second light-emitting diode LD2 may emit a second light L2 having the first color, for example. The third light-emitting diode LD3 may emit a third light L3 having a second color different from the first color, and the fourth light-emitting diode LD4 may emit a fourth light L4 having the second color. The fifth light-emitting diode LD5 may emit a fifth light L5 having a third color different from the first color and the second color, and the sixth light-emitting diode LD6 may emit a sixth light L6 having the third color. In an embodiment, the first color may be red, the second color may be green, and the third color may be blue, for example. However, the disclosure is not limited thereto.

The second substrate SUB2 may be disposed on the organic light-emitting display panel 100 including the first to sixth light-emitting diodes LD1, LD2, LD3, LD4, LD5, and LD6. The pixel electrode layer PEL may be disposed on the second substrate SUB2. In an embodiment, a pixel defining layer PDL defining an opening in which the light-emitting diodes LD are disposed may correspond to the fifth insulation layer IL5 shown in FIG. 4, for example.

In an embodiment, the pixel electrode layer PEL may include a plurality of pixel electrodes respectively disposed in the pixel areas PXA1, PXA2, PXA3, PXA4, PXA5, and PXA6. In an embodiment, the pixel electrode layer PEL may include first to sixth pixel electrodes PEL PE2, PE3, PE4, PE5, and PE6, and the first to sixth pixel electrodes PEL PE2, PE3, PE4, PE5, and PE6 may overlap the first to sixth pixel areas PXA1, PXA2, PXA3, PXA4, PXA5, and PXA6, respectively, for example.

The first to sixth pixel electrodes PEL PE2, PE3, PE4, PE5, and PE6 may be disposed in the same layer and may include the same material. The first to sixth pixel electrodes PEL PE2, PE3, PE4, PE5, PE6 may not be connected to each other and may be spaced apart from each other.

Each of the first to sixth pixel electrodes PE1, PE2, PE3, PE4, PE5, and PE6 may have a quadrangular (e.g., rectangular) shape. In an embodiment, each of the first to sixth pixel electrodes PE1, PE2, PE3, PE4, PE5, and PE6 may have a quadrangular (e.g., rectangular) shape, and an extension direction of a first side may be defined as an x direction and an extension direction of the second side orthogonal to the first side may be defined as a y direction, a direction opposite to the x direction may be defined as a −x direction, and a direction opposite to the y direction may be defined as a −y direction.

In an embodiment, first to sixth slits SL1, SL2, SL3, SL4, SL5, and SL6 may be defined in the first to sixth pixel electrodes PE1, PE2, PE3, PE4, PE5, and PE6, respectively. The first slits SL1 may be defined in the first pixel electrode PE1, and the first slits SL1 may extend in a first diagonal direction DDR1. The second slits SL2 may be defined in the second pixel electrode PE2, and the second slits SL2 may extend in a second diagonal direction DDR2. The second diagonal direction DDR2 may be a direction crossing the first diagonal direction DDR1.

The first diagonal direction DDR1 may travel between the −x direction and the y direction, and the second diagonal direction DDR2 may travel between the x direction and the y direction. In an embodiment, the first diagonal direction DDR1 and the second diagonal direction DDR2 may be orthogonal to each other, for example. The first diagonal direction DDR1 may be a direction inclined by about 135° with respect to the x direction, and the second diagonal direction DDR2 may be a direction inclined by about 45° with respect to the x direction. However, the disclosure is not limited thereto.

The third slits SL3 may be defined in the third pixel electrode PE3, and the fifth slits SL5 may be defined in the fifth pixel electrode PE5, and the third slit SL3 and the fifth slits SL5 may extend in the same direction as that of the first slits SL1. Also, the fourth slits SL4 may be defined in the fourth pixel electrode PE4, and the sixth slits SL6 may be defined in the sixth pixel electrode PE6, and the fourth slits SL4 and the sixth slits SL6 may extend in the same direction as that of the second slits SL2. That is, the third slits SL3 and the fifth slits SL5 may extend in the first diagonal direction DDR1, and the fourth slits SL4 and the sixth slits SL6 may extend in the second diagonal direction DDR2.

The common electrode layer CEL may be disposed on the pixel electrode layer PEL. The common electrode layer CEL may be entirely disposed in the display area DA, and may overlap the pixel electrode layer PEL.

The liquid crystal layer LCL may be disposed between the pixel electrode layer PEL and the common electrode layer CEL. The liquid crystal layer LCL may include liquid crystal molecules LCM. In an embodiment, the liquid crystal molecules LCM may include first liquid crystal molecules LCM1 overlapping the first pixel electrode PE1, second liquid crystal molecules LCM2 overlapping the second pixel electrode PE2, third liquid crystal molecules LCM3 overlapping the third pixel electrode PE3, fourth liquid crystal molecules LCM4 overlapping the fourth pixel electrode PE4, fifth liquid crystal molecules LCM5 overlapping the fifth pixel electrode PE5, and sixth liquid crystal molecules LCM6 overlapping the sixth pixel electrode PE6, for example. The alignment direction of the liquid crystal molecules LCM may vary according to the degree of voltage application. In an embodiment, the liquid crystal molecules LCM may be aligned in a vertical direction VDR when no voltage is applied, and may be aligned in a diagonal direction when voltage is applied, for example.

A voltage may be applied to each of the pixel electrode layer PEL and the common electrode layer CEL. In an embodiment, the liquid crystal display panel 200 may further include a driving element connected to the pixel electrode layer PEL and the common electrode layer CEL, and applying a voltage to the pixel electrode layer PEL and the common electrode layer CEL, for example.

Figure 7:
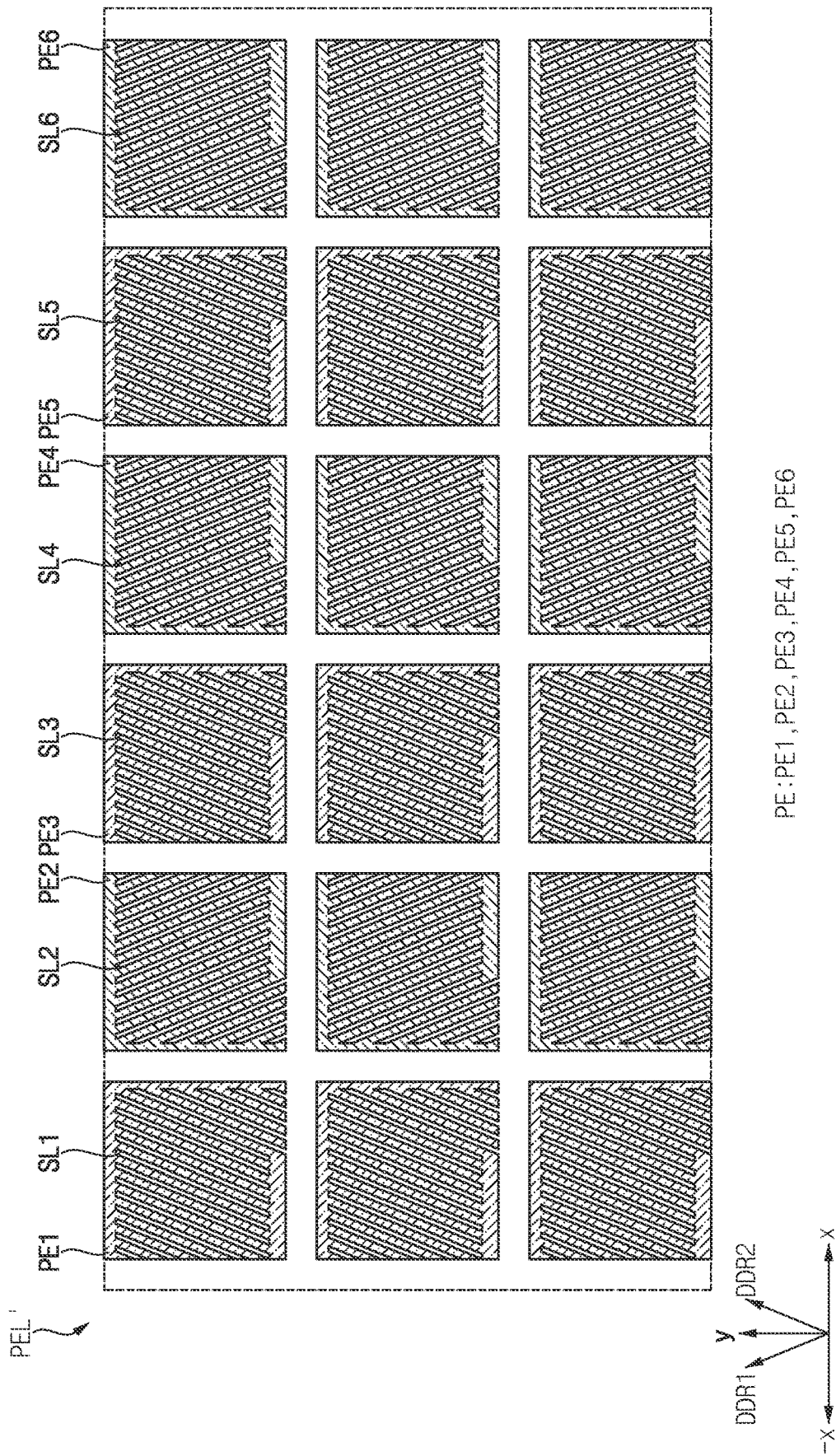
FIG. 7 is a plan view illustrating another embodiment of FIG. 6.

FIG. 7 is a plan view illustrating another embodiment of FIG. 6.

In an embodiment, FIG. 7 is a plan view illustrating another embodiment of a planar arrangement of the pixel electrode layer of FIG. 6.

Referring to FIG. 7, in an embodiment, the pixel electrode layer PEL' may include a plurality of pixel electrodes respectively disposed in the pixel areas PXA1, PXA2, PXA3, PXA4, PXA5, and PXA6. In an embodiment, the pixel electrode layer PEL may include first to sixth pixel electrodes PE1, PE2, PE3, PE4, PE5, and PE6, and the first to sixth pixel electrodes PE1 and PE2, PE3, PE4, PE5, and PE6 may overlap the first to sixth pixel areas PXA1, PXA2, PXA3, PXA4, PXA5, and PXA6, respectively.

In an embodiment, the first to sixth slits SL1, SL2, SL3, SL4, SL5, and SL6 may be defined in the first to sixth pixel electrodes PE1, PE2, PE3, PE4, PE5, and PE6, respectively. The first slits SL1 may be defined in the first pixel electrode PE1, and the first slits SL1 may extend in the second diagonal direction DDR2. The second slits SL2 may be defined in the second pixel electrode PE2, and the second slits SL2 may extend in the first diagonal direction DDR1.

In an embodiment, the first diagonal direction DDR1 may be a direction inclined by about 135° with respect to the x-direction, and the second diagonal direction DDR2 may be a direction inclined by about 45° with respect to the x-direction, for example. However, the disclosure is not limited thereto.

The third slits SL3 may be defined in the third pixel electrode PE3, and the fifth slits SL5 may be defined in the fifth pixel electrode PE5, and the third slits SL3 and the fifth slits SL5 may extend in the same direction as that of the first slits SL1. Also, the fourth slits SL4 may be defined in the fourth pixel electrode PE4, the sixth slits SL6 may be defined in the sixth pixel electrode PE6, and the fourth slits SL4 and the sixth slits SL6 may extend in the same direction as that of the second slits SL2. That is, the third slits SL3 and the fifth slits SL5 may extend in the second diagonal direction DDR2, and the fourth slits SL4 and the sixth slits SL6 may extend in the first diagonal direction DDR1.

Figure 8:
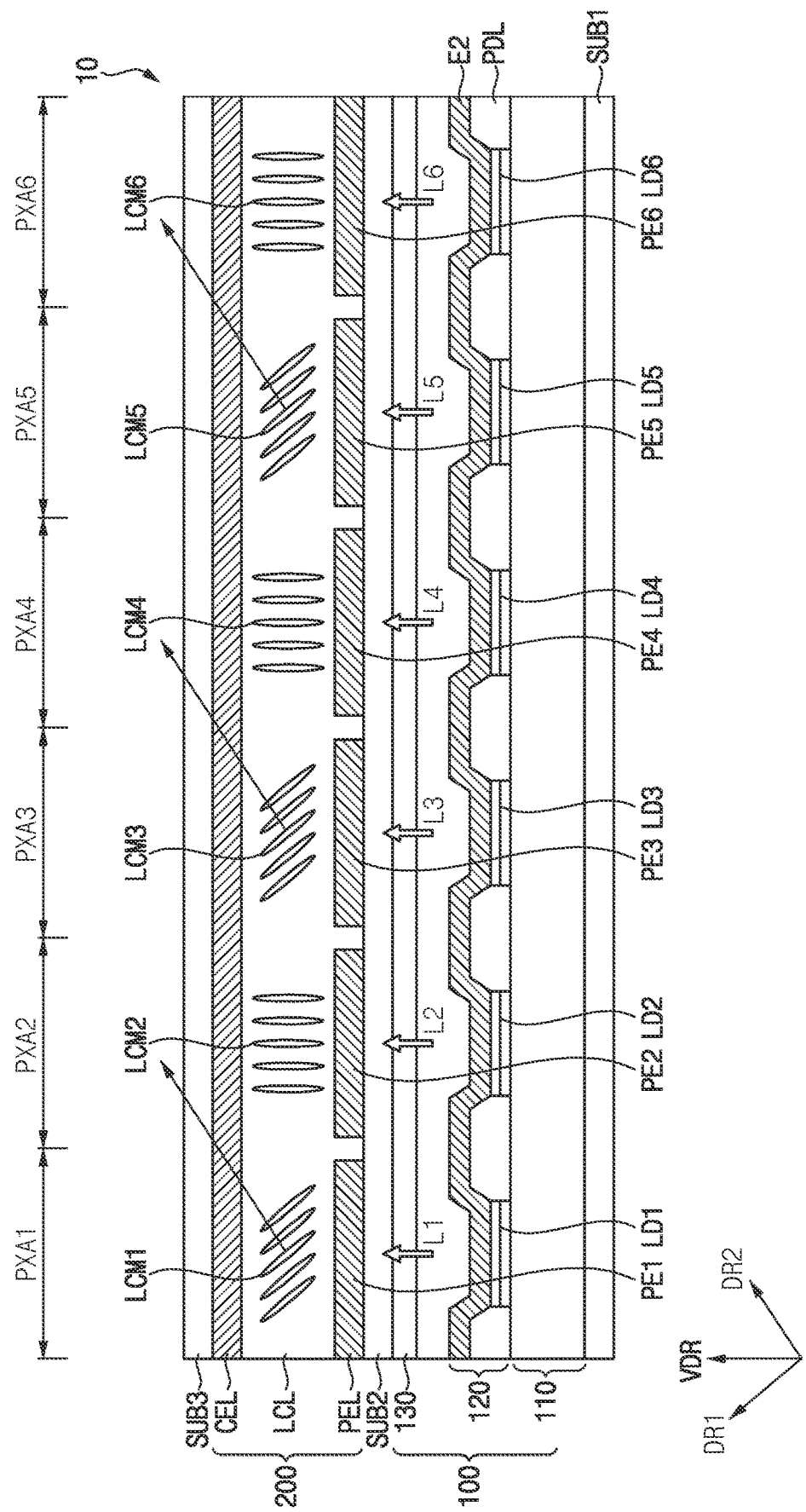
FIG. 8 is a cross-sectional view illustrating a first viewing angle mode of the display device of FIG. 5.
Figure 9:
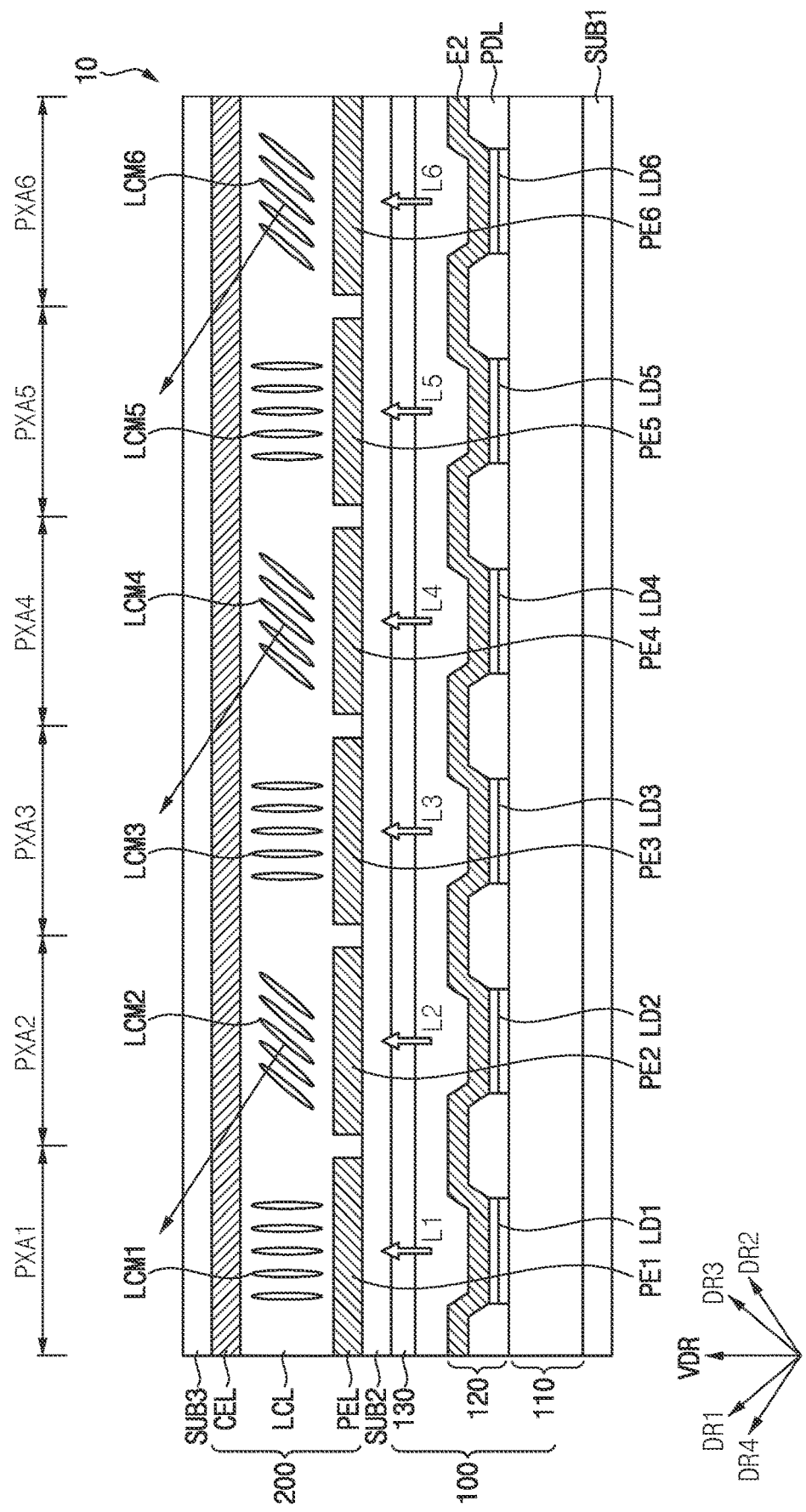
FIG. 9 is a cross-sectional view illustrating a second viewing angle mode of the display device of FIG. 5.
Figure 10:
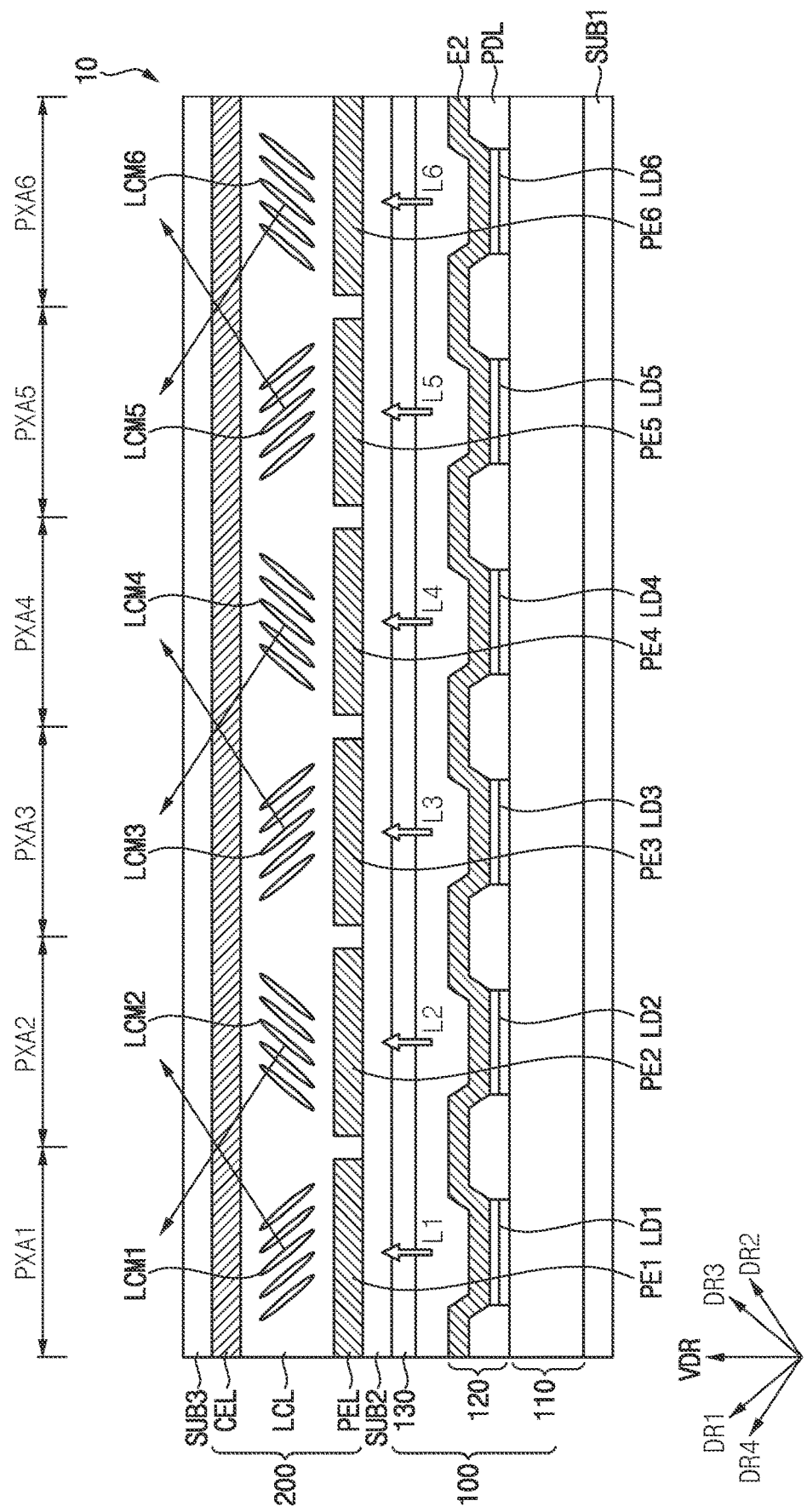
FIG. 10 is a cross-sectional view illustrating a third viewing angle mode of the display device of FIG. 5.

FIG. 8 is a cross-sectional view illustrating a first viewing angle mode of the display device of FIG. 5. FIG. 9 is a cross-sectional view illustrating a second viewing angle mode of the display device of FIG. 5. FIG. 10 is a cross-sectional view illustrating a third viewing angle mode of the display device of FIG. 5.

FIGS. 8 to 10 are cross-sectional views for explaining an operating principle of the display device 10 for each mode of the display device 10. In an embodiment, FIG. 8 may illustrate a first viewing angle mode in which the display device 10 displays a screen only to the right, FIG. 9 may illustrate a second viewing angle mode in which the display device 10 displays a screen only to the left, and FIG. 10 may illustrate a third viewing angle mode in which the display device 10 displays a screen in both left and right directions, for example.

Referring further to FIG. 8, in an embodiment, the first pixel electrode PE1, the third pixel electrode PE3, and the fifth pixel electrode PE5 may receive the same voltage as each other. The second pixel electrode PE2, the fourth pixel electrode PE4, and the sixth pixel electrode PE6 may receive the same voltage as each other. In an embodiment, the first pixel electrode PE1, the third pixel electrode PE3, and the fifth pixel electrode PE5 may receive a first voltage, and the second pixel electrode PE2, the fourth pixel electrode PE4 and the sixth pixel electrode PE6 may receive a second voltage, for example.

That is, among the two adjacent pixel areas emitting light of the same color, a first voltage may be applied to one of the two adjacent pixel areas, and a second voltage may be applied to the other pixel area. In addition, a third voltage may be applied to the common electrode layer CEL.

In an embodiment, the first voltage and the second voltage may be different from each other. In an embodiment, the first voltage and the third voltage may be different from each other, and the second voltage and the third voltage may be the same as each other, for example. That is, when the first pixel electrode PE1, the third pixel electrode PE3, and the fifth pixel electrode PE5 receive a different voltage from that of the common electrode layer CEL, the first liquid crystal molecules LCM1, the third liquid crystal molecules LCM3, and the fifth liquid crystal molecules LCM5 may receive a voltage. When the second pixel electrode PE2, the fourth pixel electrode PE4, and the sixth pixel electrode PE6 receive the same voltage as that of the common electrode layer CEL, the second liquid crystal molecules LCM2, the fourth liquid crystal molecules LCM4, and the sixth liquid crystal molecules LCM6 may not receive a voltage.

When the first liquid crystal molecules LCM1, the third liquid crystal molecules LCM3, and the fifth liquid crystal molecules LCM5 receive a voltage, the first liquid crystal molecules LCM1, the third liquid crystal molecules LCM3 and the fifth liquid crystal molecules LCM5 may be aligned in a first direction DR1 crossing the vertical direction VDR. The vertical direction VDR may be a direction from the pixel electrode layer PEL to the common electrode layer CEL, and the first direction DR1 may be a diagonal direction with respect to the vertical direction VDR.

When the second liquid crystal molecules LCM2, the fourth liquid crystal molecules LCM4, and the sixth liquid crystal molecules LCM6 do not receive a voltage, the second liquid crystal molecules LCM2, the fourth liquid crystal molecules LCM4 and the sixth liquid crystal molecules LCM6 may maintain an arrangement in the vertical direction VDR.

When the first liquid crystal molecules LCM1, the third liquid crystal molecules LCM3, and the fifth liquid crystal molecules LCM5 are aligned in the first direction DR1, the liquid crystal layer LCL may transmit the first light L1, the third light L3, and the fifth light L5. When the second liquid crystal molecules LCM2, the fourth liquid crystal molecules LCM4, and the sixth liquid crystal molecules LCM6 are arranged in the vertical direction VDR, the liquid crystal layer LCL may not transmit the second light L2, the fourth light L4, and the sixth light L6.

Specifically, the first liquid crystal molecules LCM1, the third liquid crystal molecules LCM3, and the fifth liquid crystal molecules LCM5 may change traveling directions of the first light L1, the third light L3 and the fifth light L5, respectively. The first light-emitting diode LD1, the third light-emitting diode LD3, and the fifth light-emitting diode LD5 may respectively emit the first light L1, the third light L3, and the fifth light L5 in the vertical direction VDR, and the liquid crystal layer LCL may change the traveling directions of the first light L1, the third light L3, and the fifth light L5 into the second direction DR2. The second direction DR2 may cross the first direction DR1 with the vertical direction VDR interposed therebetween.

The second liquid crystal molecules LCM2, the fourth liquid crystal molecules LCM4, and the sixth liquid crystal molecules LCM6 may prevent the second light L2, the fourth light L4, and the sixth light L6 from passing through the liquid crystal layer LCL. The second light-emitting diode LD2, the fourth light-emitting diode LD4, and the sixth light-emitting diode LD6 may emit the second light L2, the fourth light L4, and the sixth light L6 in the vertical direction VDR, respectively, and the liquid crystal layer LCL may prevent the second light L2, the fourth light L4, and the sixth light L6 from emitting in the vertical direction VDR.

Accordingly, the liquid crystal display panel 200 may transmit only the first light L1, the third light L3, and the fifth light L5 respectively emitted from the first light-emitting diode LD1, the third light-emitting diode LD3, and the fifth light-emitting diode LD5 and emit the first light L1, the third light L3, and the fifth light L5 to the outside in the second direction DR2. Accordingly, only a user in a predetermined position (e.g., the second direction DR2 with respect to the display device 10) may view the screen of the display device 10, and the viewing angle of the display device 10 may be adjusted.

Referring further to FIG. 9, in an embodiment, the first voltage and the third voltage may be the same as each other, and the second voltage and the third voltage may be different from each other.

That is, when the first pixel electrode PE1, the third pixel electrode PE3, and the fifth pixel electrode PE5 receive the same voltage as that of the common electrode layer CEL, the first liquid crystal molecules LCM1, the third liquid crystal molecules LCM3, and the fifth liquid crystal molecules LCM5 may not receive a voltage. When the second pixel electrode PE2, the fourth pixel electrode PE4, and the sixth pixel electrode PE6 receive a different voltage from that of the common electrode layer CEL, the second liquid crystal molecules LCM2, the fourth liquid crystal molecules LCM4, and the sixth liquid crystal molecules LCM6 may receive a voltage.

When the first liquid crystal molecules LCM1, the third liquid crystal molecules LCM3, and the fifth liquid crystal molecules LCM5 do not receive a voltage, the first liquid crystal molecules LCM1, the third liquid crystal molecules LCM3 and the fifth liquid crystal molecules LCM5 may maintain an arrangement in the vertical direction VDR.

When the second liquid crystal molecules LCM2, the fourth liquid crystal molecules LCM4, and the sixth liquid crystal molecules LCM6 receive a voltage, the second liquid crystal molecules LCM2, the fourth liquid crystal molecules LCM4 and the sixth liquid crystal molecules LCM6 may be aligned in a third direction DR3. The third direction DR3 may cross the first direction DR1 with the vertical direction VDR interposed therebetween, and may be a diagonal direction with respect to the vertical direction VDR.

When the first liquid crystal molecules LCM1, the third liquid crystal molecules LCM3, and the fifth liquid crystal molecules LCM5 are arranged in the vertical direction VDR, the liquid crystal layer LCL may not transmit the first light L1, the third light L3, and the fifth light L5. When the second liquid crystal molecules LCM2, the fourth liquid crystal molecules LCM4, and the sixth liquid crystal molecules LCM6 are aligned in the third direction DR3, the liquid crystal layer LCL may transmit the second light L2, the fourth light L4, and the sixth light L6.

Specifically, the first liquid crystal molecules LCM1, the third liquid crystal molecules LCM3, and the fifth liquid crystal molecules LCM5 may prevent the first light L1, the third light L3, and the fifth light L5 from passing through the liquid crystal layer LCL. The first light-emitting diode LD1, the third light-emitting diode LD3, and the fifth light-emitting diode LD5 may emit the first light L1, the third light L3, and the fifth light L5 in the vertical direction VDR, respectively, and the liquid crystal layer LCL may prevent the first light L1, the third light L3, and the fifth light L5 from emitting in the vertical direction VDR.

The second liquid crystal molecules LCM2, the fourth liquid crystal molecules LCM4, and the sixth liquid crystal molecules LCM6 may change traveling directions of the second light L2, the fourth light L4, and the sixth light L6, respectively. The second light-emitting diode LD2, the fourth light-emitting diode LD4, and the sixth light-emitting diode LD6 may respectively emit the second light L2, the fourth light L4, and the sixth light L6 in the vertical direction VDR, and the liquid crystal layer LCL may change the traveling directions of the second light L2, the fourth light L4, and the sixth light L6 into the fourth direction DR4. The fourth direction DR4 may cross the third direction DR3 with the vertical direction VDR interposed therebetween, and cross the second direction DR2 with the vertical direction VDR interposed therebetween.

Accordingly, the liquid crystal display panel 200 may transmit only the second light L2, the fourth light L4, and the sixth light L6 respectively emitted from the second light-emitting diode LD2, the fourth light-emitting diode LD4, and the sixth light-emitting diode LD6 and emit the second light L2, the fourth light L4, and the sixth light L6 to the outside in the fourth direction DR4. Accordingly, only a user in a predetermined position (e.g., the fourth direction DR4 with respect to the display device 10) may view the screen of the display device 10, and the viewing angle of the display device 10 may be adjusted.

Referring to FIG. 10, the first pixel electrode PE1, the third pixel electrode PE3, and the fifth pixel electrode PE5 may receive the same voltage. The second pixel electrode PE2, the fourth pixel electrode PE4, and the sixth pixel electrode PE6 may receive the same voltage. In an embodiment, the first pixel electrode PE1, the third pixel electrode PE3, and the fifth pixel electrode PE5 may receive a first voltage, for example. The second pixel electrode PE2, the fourth pixel electrode PE4 and the sixth pixel electrode PE6 may receive a second voltage.

In an embodiment, the first pixel electrode PE1 and the second pixel electrode PE2 may receive the same voltage.

Accordingly, the first voltage and the second voltage may be the same as each other. However, the disclosure is not limited thereto.

In an embodiment, the first voltage and the third voltage may be different from each other, and similarly, the second voltage and the third voltage may be different from each other. That is, when the first pixel electrode PE1, the third pixel electrode PE3, and the fifth pixel electrode PE5 receive a different voltage from that of the common electrode layer CEL, the first liquid crystal molecules LCM1, the third liquid crystal molecules LCM3, and the fifth liquid crystal molecules LCM5 may receive a voltage. When the second pixel electrode PE2, the fourth pixel electrode PE4, and the sixth pixel electrode PE6 receive a different voltage from that of the common electrode layer CEL, the second liquid crystal molecules LCM2, the fourth liquid crystal molecules LCM4, and the sixth liquid crystal molecules LCM6 may receive a voltage.

When the first liquid crystal molecules LCM1, the third liquid crystal molecules LCM3, and the fifth liquid crystal molecules LCM5 receive a voltage, the first liquid crystal molecules LCM1, the third liquid crystal molecules LCM3, and the fifth liquid crystal molecules LCM5 may be aligned in the first direction DR1. When the second liquid crystal molecules LCM2, the fourth liquid crystal molecules LCM4, and the sixth liquid crystal molecules LCM6 receive a voltage, the second liquid crystal molecules LCM2, the fourth liquid crystal molecules LCM4 and the sixth liquid crystal molecules LCM6 may be aligned in the third direction DR3.

When the first liquid crystal molecules LCM1, the third liquid crystal molecules LCM3, and the fifth liquid crystal molecules LCM5 are aligned in the first direction DR1, the liquid crystal layer LCL may transmit the first light L1, the third light L3, and the fifth light L5. When the second liquid crystal molecules LCM2, the fourth liquid crystal molecules LCM4, and the sixth liquid crystal molecules LCM6 are aligned in the third direction DR3, the liquid crystal layer LCL may transmit the second light L2, the fourth light L4, and the sixth light L6.

Specifically, the first liquid crystal molecules LCM1, the third liquid crystal molecules LCM3, and the fifth liquid crystal molecules LCM5 may change traveling directions of the first light L1, the third light L3 and the fifth light L5, respectively. The first light-emitting diode LD1, the third light-emitting diode LD3, and the fifth light-emitting diode LD5 may respectively emit the first light L1, the third light L3, and the fifth light L5 in the vertical direction VDR, and the liquid crystal layer LCL may change the traveling directions of the first light L1, the third light L3, and the fifth light L5 into the second direction DR2.

The second liquid crystal molecules LCM2, the fourth liquid crystal molecules LCM4, and the sixth liquid crystal molecules LCM6 may change traveling directions of the second light L2, the fourth light L4, and the sixth light L6, respectively. The second light-emitting diode LD2, the fourth light-emitting diode LD4, and the sixth light-emitting diode LD6 may respectively emit the second light L2, the fourth light L4, and the sixth light L6 in the vertical direction VDR, and the liquid crystal layer LCL may change the traveling directions of the second light L2, the fourth light L4, and the sixth light L6 into the fourth direction DR4.

Accordingly, the liquid crystal display panel 200 may transmit the first to sixth lights L1, L2, L3, L4, L5, and L6 respectively emitted from the first to sixth light-emitting diodes LD1, LD2, LD3, LD4, LD5 and LD6 and emit the first to sixth lights L1, L2, L3, L4, L5, and L6 to the outside.

However, the liquid crystal display panel 200 may emit the first light L1, the third light L3, and the fifth light L5 in the second direction DR2, and emit the second light L2, the fourth light L4, and the sixth light L6 in the fourth direction DR4. Accordingly, both users in the second direction DR2 and the fourth direction DR4 with respect to the display device 10 may view the screen of the display device 10.

In an embodiment, when the display device 10 displays a screen to the right with respect to the display device 10 in the first viewing angle mode of FIG. 8, in the second viewing angle mode of FIG. 9, the display device 10 may display the screen to the left with respect to the display device 10, for example. However, the disclosure is not limited thereto, and when the display device 10 displays a screen to the left with respect to the display device in the first viewing angle mode of FIG. 8, in the second viewing angle mode of FIG. 9, the display device 10 may display the screen to the right with respect to the display device 10. Accordingly, the display device 10 may adjust the viewing angle of the display device 10 by changing the mode of the display device 10.

Figure 11:
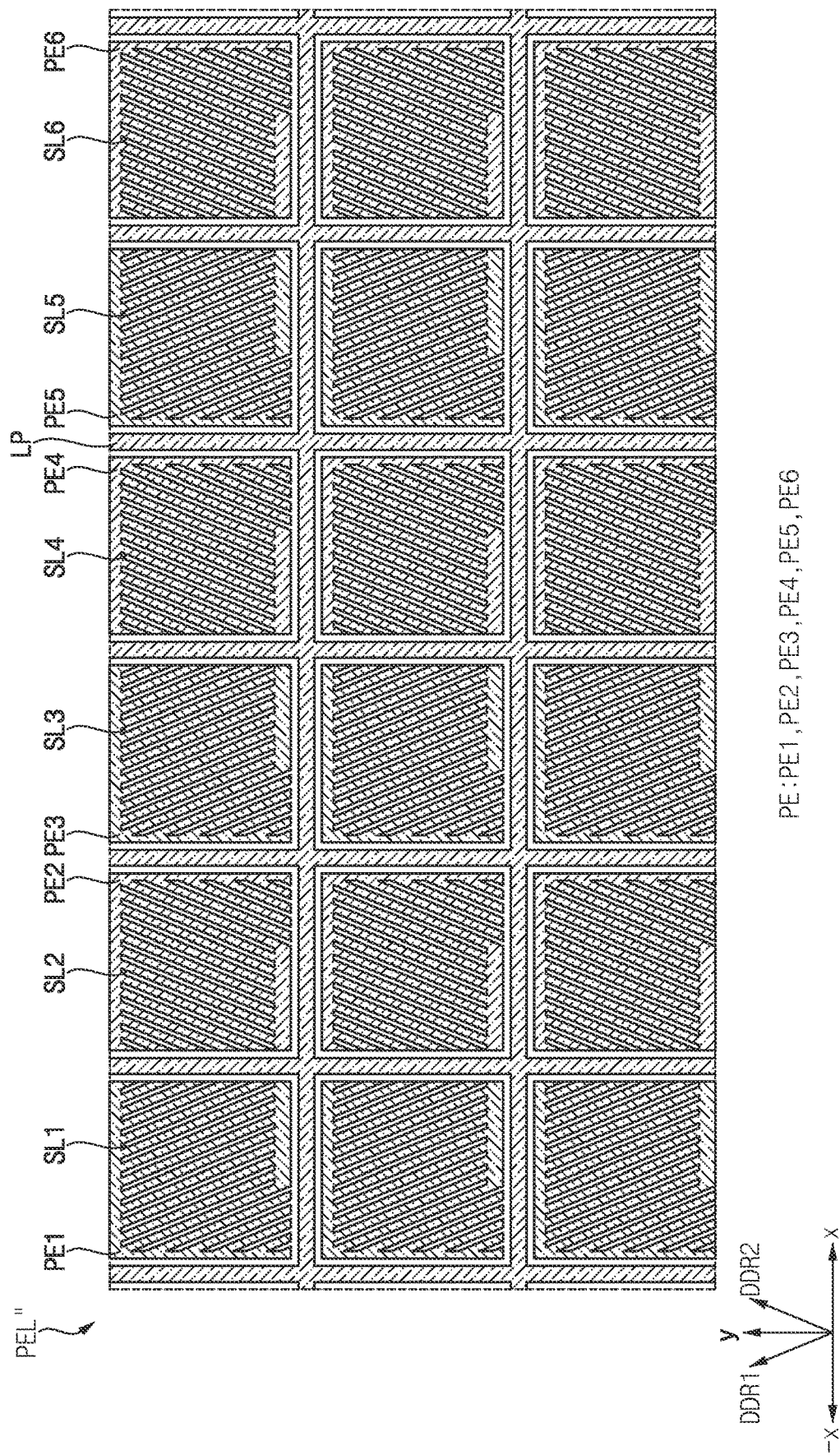
FIG. 11 is a plan view illustrating another embodiment of FIG. 6.

FIG. 11 is a plan view illustrating another embodiment of FIG. 6.

Since the pixel electrode layer PEL" of FIG. 11 is the same as the pixel electrode layer PEL of FIG. 6 except for the arrangement of the grid pattern LP, the overlapping description may be omitted.

Referring to FIGS. 5 and 11, in an embodiment, the pixel electrode layer PEL" may include a plurality of pixel electrodes PE and a grid pattern LP respectively disposed in the pixel areas PXA.

The pixel electrode layer PEL" may include first to sixth pixel electrodes PE1, PE2, PE3, PE4, PE5, and PE6. The first to sixth pixel electrodes PE1, PE2, PE3, PE4, PE5, and PE6 may overlap the first to sixth pixel areas PXA1, PXA2, PXA3, PXA4, PXA5, and PXA6, respectively.

The first to sixth pixel electrodes PE1, PE2, PE3, PE4, PE5, and PE6 may be disposed in the same layer and may include the same material. The first to sixth pixel electrodes PE1, PE2, PE3, PE4, PE5, and PE6 may not be connected to each other and may be spaced apart from each other.

The grid pattern LP may be disposed in the same layer as the first to sixth pixel electrodes PE1, PE2, PE3, PE4, PE5, and PE6, and may include the same material. The grid pattern LP may have a grid shape and may be formed between the first to sixth pixel electrodes PE1, PE2, PE3, PE4, PE5, and PE6. Also, the grid pattern LP may be spaced apart from the first to sixth pixel electrodes PE1, PE2, PE3, PE4, PE5, and PE6.

The same voltage as that of the common electrode layer CEL may be applied to the grid pattern LP. Accordingly, the grid pattern LP may prevent light leakage of each of the pixel areas PXA.

The display devices in the embodiments may be applied to a display device included in a computer, a notebook, a mobile phone, a smartphone, a smart pad, a portable media player ("PMP"), a personal digital assistance ("PDA"), an MP3 player, or the like.

Although the display devices in the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a substrate including:
        a first pixel area; and
        a second pixel area adjacent to the first pixel area;
    a display panel disposed on the substrate and including:
        a first light-emitting diode emitting a first light having a first color and overlapping the first pixel area; and
        a second light-emitting diode emitting a second light having the first color and overlapping the second pixel area;
    a first pixel electrode which is disposed on the display panel and overlaps the first pixel area, and in which first slits are defined;
    a second pixel electrode which is disposed on the display panel, is spaced apart from the first pixel electrode, and overlaps the second pixel area, and in which second slits extending in a direction different from the first slits are defined;
    a common electrode layer disposed on the first pixel electrode and the second pixel electrode; and
    a liquid crystal layer disposed between the first and second pixel electrodes and the common electrode layer and including a plurality of liquid crystal molecules.

2. The display device of claim 1, wherein the first slits extend in a first diagonal direction, and
    the second slits extend in a second diagonal direction crossing the first diagonal direction.

3. The display device of claim 2, wherein the first diagonal direction and the second diagonal direction are perpendicular to each other.

4. The display device of claim 1, wherein the first pixel electrode and the second pixel electrode are disposed in a same layer and including a same material.

5. The display device of claim 1, wherein the first pixel electrode and the second pixel electrode respectively receive different voltages from each other.

6. The display device of claim 5, wherein the plurality of liquid crystal molecules includes first liquid crystal molecules overlapping the first pixel electrode and second liquid crystal molecules overlapping the second pixel electrode, and
    when the first pixel electrode receives a voltage different from that of the common electrode layer and the second pixel electrode receives a voltage equal to that of the common electrode layer,
    the first liquid crystal molecules are arranged in a first direction crossing a vertical direction and the second liquid crystal molecules are arranged in the vertical direction.

7. The display device of claim 6, wherein the vertical direction is a direction from the first pixel electrode to the common electrode layer and
    the first direction is a diagonal direction with respect to the vertical direction.

8. The display device of claim 6, wherein the liquid crystal layer transmits the first light and does not transmit the second light.

9. The display device of claim 8, wherein the first light-emitting diode emits the first light in the vertical direction and
    the liquid crystal layer changes a traveling direction of the first light into a second direction crossing the first direction with the vertical direction interposed therebetween.

10. The display device of claim 1, wherein the first pixel electrode and the second pixel electrode receive a same voltage.

11. The display device of claim 10, wherein the plurality of liquid crystal molecules includes first liquid crystal molecules overlapping the first pixel electrode and second liquid crystal molecules overlapping the second pixel electrode, and when each of the first pixel electrode and the second pixel electrode receives a different voltage from that of the common electrode layer, the first liquid crystal molecules are arranged in a first direction crossing a vertical direction and the second liquid crystal molecules are arranged in a third direction crossing the first direction with the vertical direction interposed therebetween.

12. The display device of claim 11, wherein the liquid crystal layer transmits the first light and the second light.

13. The display device of claim 12, wherein the first light-emitting diode emits the first light in the vertical direction and the second light-emitting diode emits the second light in the vertical direction, and the liquid crystal layer changes a traveling direction of the first light into a second direction crossing the first direction with the vertical direction interposed therebetween and changes a traveling direction of the second light in a fourth direction crossing the third direction with the vertical direction interposed therebetween.

14. A display device comprising:
a substrate including:
a first pixel area;
a second pixel area adjacent to the first pixel area;
a third pixel area; and
a fourth pixel area adjacent to the third pixel area;
a display panel disposed on the substrate and including:
a first light-emitting diode which emits a first light having a first color and overlapping the first pixel area;
a second light-emitting diode which emits a second light having the first color and overlapping the second pixel area;
a third light-emitting diode which emits a third light having a second color different from the first color and overlapping the third pixel area; and
a fourth light-emitting diode which emits a fourth light having the second color and overlapping the fourth pixel area;
a first pixel electrode which is disposed on the display panel and overlaps the first pixel area, and in which first slits are defined;
a second pixel electrode which is disposed on the display panel, is spaced apart from the first pixel electrode, and overlaps the second pixel area, and in which second slits extending in a direction different from the first slits are defined;
a third pixel electrode which is disposed on the display panel, is spaced apart from the first and second pixel electrodes, and overlaps the third pixel area, and in which third slits extending in a direction equal to the first slits are defined;
a fourth pixel electrode which is disposed on the display panel, is spaced apart from the first to third pixel electrodes, and overlaps the fourth pixel area, and in which fourth slits extending in a direction equal to the second slits are defined;
a common electrode layer disposed on the first to fourth pixel electrodes; and
a liquid crystal layer disposed between the first to fourth pixel electrode and the common electrode layer and including a plurality of liquid crystal molecules.

15. The display device of claim 14, wherein the first to fourth pixel electrodes are disposed in a same layer, and include a same material.

16. The display device of claim 14, wherein the first pixel electrode and the third pixel electrode receive a same voltage as each other and the second pixel electrode and the fourth pixel electrode receive a same voltage as each other.

17. The display device of claim 16, wherein each of the first to fourth pixel electrodes receives a voltage different from that of the common electrode layer.

18. The display device of claim 17, wherein the plurality of liquid crystal molecules includes first liquid crystal molecules overlapping the first pixel electrode, second liquid crystal molecules overlapping the second pixel electrode, third liquid crystal molecules overlapping the third pixel electrode, and fourth liquid crystal molecules overlapping the fourth pixel electrode, and when the first pixel electrode and the third pixel electrode receive the voltage, the first liquid crystal molecules and the third liquid crystal molecules are arranged in a first direction crossing a vertical direction.

19. The display device of claim 18, wherein the second pixel electrode and the fourth pixel electrode receive the voltage, the second liquid crystal molecules and the fourth liquid crystal molecules are arranged in a third direction crossing the first direction with the vertical direction interposed therebetween.

20. The display device of claim 19, wherein the first to fourth light-emitting diodes emit the first to fourth lights in the vertical direction, respectively, and the liquid crystal layer changes a traveling direction of each of the first light and the third light into a second direction crossing the first direction with the vertical direction therebetween, and changes a traveling direction of each of the second light and the fourth light into a fourth direction crossing the third direction with the vertical direction therebetween.

* * * * *